United States Patent [19]

Yoshida

[11] Patent Number: 5,675,264

[45] Date of Patent: Oct. 7, 1997

[54] PHASE DIFFERENTIAL CIRCUIT HAVING HIGH SYNCHRONICITY

[75] Inventor: Makoto Yoshida, Tokyo, Japan

[73] Assignee: NEC Corporation, Tokyo, Japan

[21] Appl. No.: 364,971

[22] Filed: Dec. 28, 1994

[30] Foreign Application Priority Data

Dec. 28, 1993 [JP] Japan ..................... 5-334467

[51] Int. Cl.[6] ............................................. H03K 19/0948
[52] U.S. Cl. ............................................. 326/121; 326/97
[58] Field of Search ............................... 326/121, 96, 97, 326/83

[56] References Cited

U.S. PATENT DOCUMENTS 5,023,480  6/1991  Gieseke et al. ..................... 326/121

FOREIGN PATENT DOCUMENTS

| | | |
|---|---|---|
| 0 239 762 | 10/1987 | European Pat. Off. . |
| 54-153539 | 3/1979 | Japan . |
| 59-97222 | 6/1984 | Japan . |
| 2145018 | 6/1990 | Japan . |
| 3-058608 | 3/1991 | Japan . |
| 4284021 | 10/1992 | Japan . |
| WO 90/06626 | 6/1990 | WIPO . |

OTHER PUBLICATIONS

"Improvement of the Gain of MOS Amplifiers," Bedrich J. Hosticka, IEEE Journal of Solid–State Circuits, vol. SC–14, No. 6, Dec. 1979, pp. 1111–1114.

*Primary Examiner*—Edward P. Westin
*Assistant Examiner*—Benjamin D. Driscoll
*Attorney, Agent, or Firm*—Foley, Hoag & Eliot, LLP

[57] ABSTRACT

A differential circuit configuration for generating an inverted signal and a non-inverted signal of an original signal is presented. The waveforms of the output signals are highly synchronous and precise owing to the circuit design which provides matched gate-to-source voltage vs drain-to-source current to produce output trace matching in the output voltage traces of a pair of pull-up transistors with a pair of pull-down transistors. The circuit configuration does not require adjustable capacitors or driving circuits, and is therefore suitable for use in advanced compact devices.

5 Claims, 3 Drawing Sheets

PHASE DIFFERENTIAL CIRCUIT HAVING HIGH SYNCHRONICITY

BACKGROUND OF THE INVENTION

1. Field of the Invention

The present invention relates to a phase differential circuit demanding high synchronicity and precision.

2. Description of the Prior Art

In digital circuitries, differential phase signals having a low skew, i.e. high synchronicity, between an original signal and its inverted signals are required. An example of a conventional method of generating such signals is shown in FIG. 2. An original signal is inputted into an input terminal 201, inverted signals of the original signal are produced in inverting circuits 210-215, and the inverted signals are outputted from an output terminal 203. In the meantime, non-inverted signals of the original signal are obtained from an output terminal 202 via delay circuit 204-209 having adjustable delay times produced with a variable capacitor 216. In the conventional technique, phase differentials are minimized using this circuit by adjusting the delay times so as to obtain the least possible phase difference between the inverted signals from the output terminal 203 and the non-inverted signal outputted from the output terminal 202. The delay time adjustments are generally made by adjusting the variable capacitor 216, but it is also possible to adjust the driving power of the transistors 204, 205.

To produce digital signal waveforms having minimal phase differences, for example 200 ps, in the conventional phase differential technique described above, there was a problem that the requirements for adjustable capacitors and driving circuits necessarily led to a large area for integrated circuit fabrication, which is contrary to the requirements of advanced compact devices.

SUMMARY OF THE INVENTION

It is therefore the object of the present invention to provide an inverting circuit applicable to making advanced compact devices for generating non-inverted and inverted output signals, both signals having a synchronicity to an original input signal and which do not require adjustable capacitors or a driving circuit for their generation.

This objective is achieved in an inverting circuit means for generating an inverted digital signal and a non-inverted signal comprising: a first N-MOS transistor for pull-down of the non-inverted signal output of the original input signal, a second P-MOS transistor for pull-up of the inverted output signal of the original input signal, a third P-MOS transistor for driving the second P-MOS transistor, and a fourth N-MOS transistor for potential control of the first N-MOS transistor. The first N-MOS transistor has a source terminal at a ground potential and a drain terminal connected to an output terminal of the non-inverted signal. The second P-MOS transistor has a gate terminal at a ground potential and a drain terminal connected to an output terminal of the inverted signal. A gate terminal of the first N-MOS transistor, a source terminal of the second P-MOS transistor, a drain terminal of the third P-MOS transistor and a drain terminal of the fourth N-MOS transistor are all connected to a common point. According to an aspect of the circuit means of the above construction, during the transition from ground potential to an operating potential, the gate-to-source voltage of the pull-down transistor circuit becomes exactly the same as that of the pull-up transistor circuit.

Another aspect of the invention is that static voltage-current characteristics of gate-to-source voltage vs. drain-to-source current for the N-MOS transistors and the P-MOS transistors are related by a specific ratio so as to produce a high synchronicity between an original input signal and its non-inverted and inverted signals. The gate-to-source voltage vs. the drain-to-source current characteristics in a pair of pull-up P-MOS transistors are matched with those in a pair of pull-down N-MOS transistors by adjusting the channel lengths, widths and the direction of the current. Matching of the operating characteristics of the pull-up and pull-down transistors generates time-dependent traces of the output signals to be the same, and promotes the production of differential phase signals having high synchronicity and precision.

DETAILED DESCRIPTION OF THE INVENTION

Figure 1:
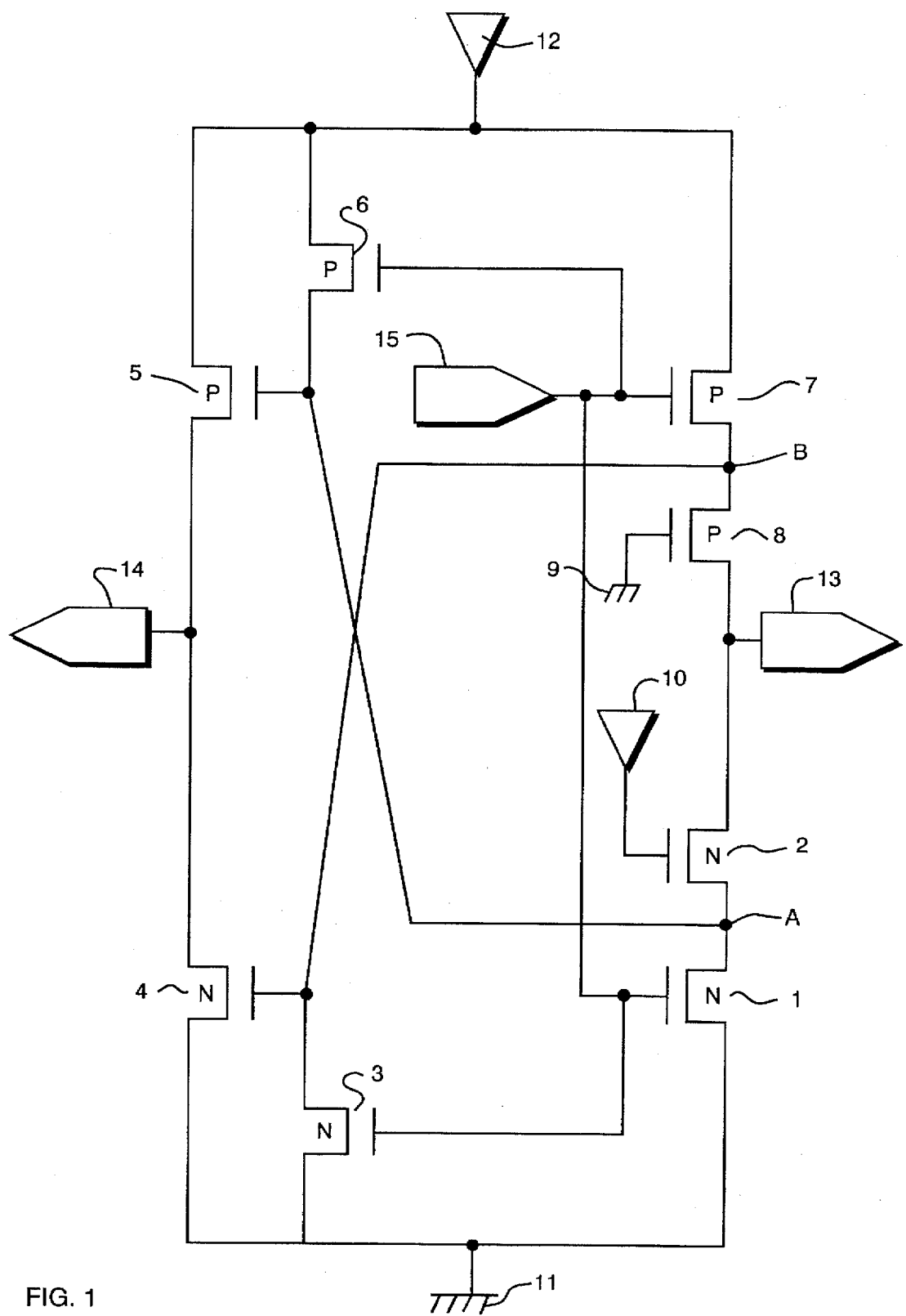
FIG. 1 is a circuit configuration of the invention.
Figure 2:
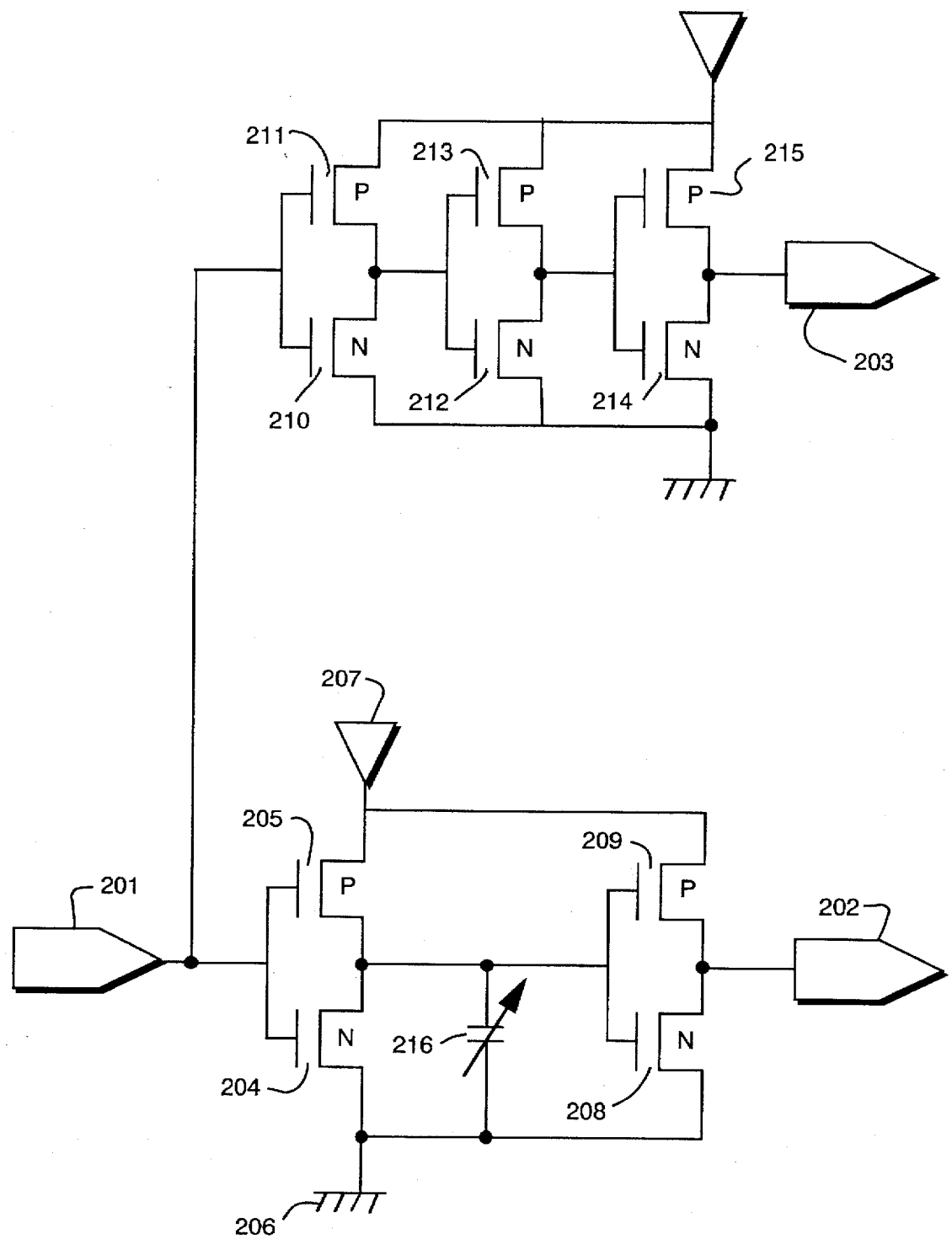
FIG. 2 is a circuit configuration of the conventional differential buffer.

FIG. 1 shows a circuit configuration of the invention comprising a pull-down transistor 4 and a pull-up transistor 8 corresponding to a pull-down N channel MOS transistor 4 (N-MOS 4) for receiving a non-inverted output signal 14 and a pull-up P channel MOS transistor 8 (P-MOS 8) for receiving an inverted output signal 13. Transistor 4 and transistor 8 respectively for pull-up and pull-down portions of the inverting circuit are fabricated so that their static characteristic curves of the gate-to-source voltage vs. the drain-to source currents are highly matched, for example by adjusting the channel lengths, channel widths and current directions within the channels. Therefore, the current driving capacity for transistor 4 and 8 are matched. Similarly, transistor 2 and transistors 5, respectively, for pull-down and pull-up portions, must be fabricated so that their static characteristics curves and the current driving capacity are matched.

The source terminal of N-MOS 4 and the gate terminal of P-MOS 8 are at the ground potential GND, and the gate terminal of N-MOS 4 and the source terminal of P-MOS 8 are at the same potential, and are connected to the drain terminal (node B) of a driving transistor P-MOS 7.

The source terminal of P-MOS 5 and the gate terminal of N-MOS 2 are at the power supply potential VDD (terminal 12), and the gate terminal of P-MOS 5 and the source terminal of N-MOS 1 are at the same potential, and are connected to the drain terminal (node A) of a driving transistor N-MOS 1.

N-MOS 1 and P-MOS 6 comprise a CMOS inverter. The output terminal of this CMOS invertor is connected to the node A. N-MOS 3 and P-MOS 7 also comprise a CMOS inverter. The output terminal of this CMOS inverter is connected to the node B.

Let us suppose that the potential of the input terminal 15 is VDD. The non-inverted output signal 14 is at potential VDD, and the inverted output signal is at potential GND.

Figure 3A:
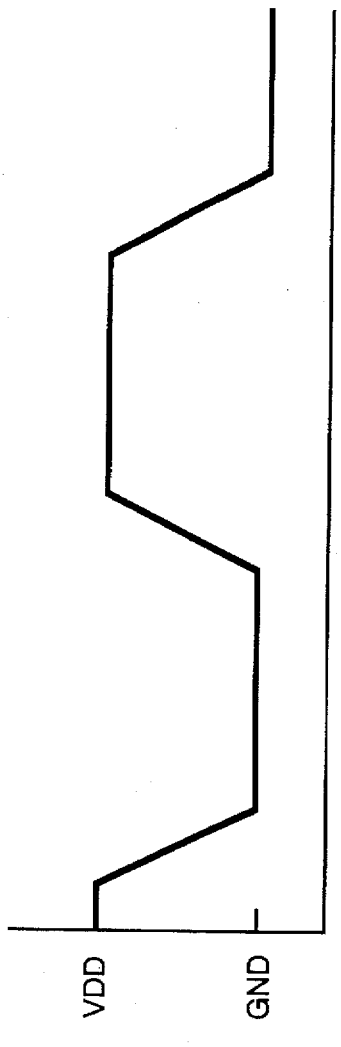
FIGS. 3A, 3B, and 3C are timing charts for the output signal waveforms associated with the present embodiment.
Figure 3B:
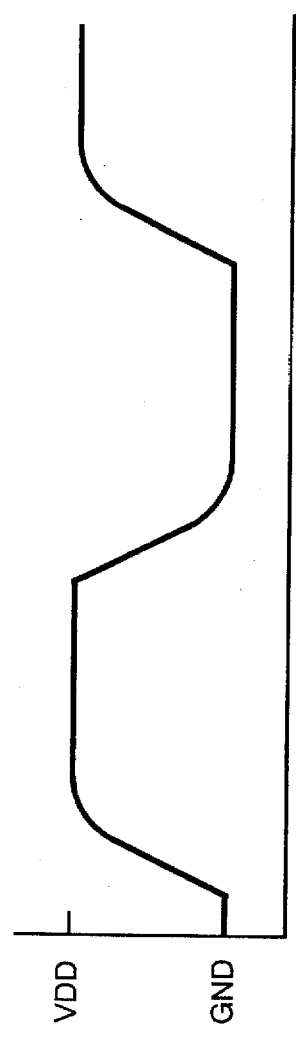
Figure 3C:
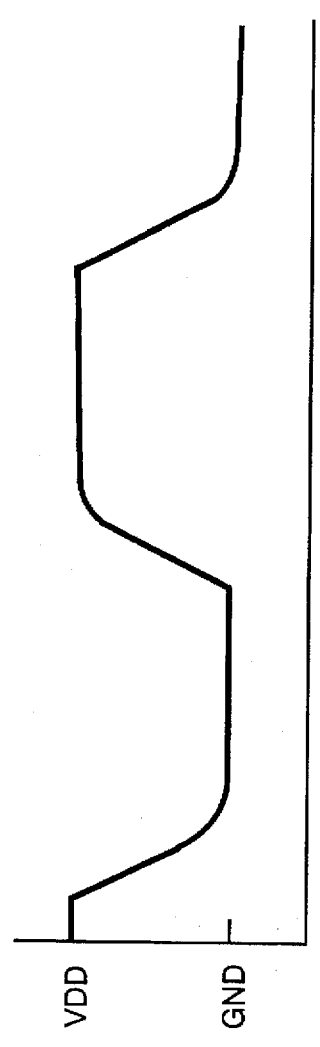

FIGS. 3A, 3B, and 3C are timing charts showing the output waveform timings for output signals generated in the inventive circuit. The potential at point B is kept at ground potential GND by a potential control transistor N-MOS 3.

When the potential of the input terminal 15 is altered from VDD to GND, the potential at point B changes from GND to VDD. At this time, the gate-to-source voltage of the pull-down transistor 4 for outputting non-inverted signal is exactly the same as that of the pull-up transistor 8 for outputting inverted signal. In other words, the potential at point B is the same as the absolute value of the gate-to-source voltage of the transistors 8 and 4.

The behavior of the circuit in the case of altering the voltage of the input terminal 15 from GND to VDD is also identical. In this case, the non-inverted output terminal 14 is at the GND potential, and the inverted output terminal 13 is at the VDD potential.

The potential of the point A is maintained at VDD by a potential control transistor P-MOS 6. When the potential of the input terminal 15 is altered from GND to VDD, the potential at the point A is altered from VDD to GND as shown in FIGS. 3A, 3B, and 3C. At this time, the gate-to-source voltage of the pull-up transistor 5 for outputting non-inverted signal is exactly the same as that of the pull-down transistor 2 for outputting the inverted output signal. In other words, the potential at point A is the same as the absolute value of the gate to source potentials of the transistors 2 and 5.

It should be noted that the current driving capacity for a P-driving transistor P-MOS 7 (third transistor) which is connected in series with the pull-up transistor P-MOS 8 must be sufficiently high, for example, not less than twice that for the pull-up transistor P-MOS 8. Similarly, it is necessary that the current driving capacity for a N-driving transistor N-MOS 1 be sufficiently high in comparison with that for the pull-down transistor N-MOS 2. This is required so that the voltage transition at A and B points will be performed quickly, so as to minimize the difference in switching times caused by the difference in the threshold values in the gate-to-source voltage of the pull-up P-MOS 8 and the pull-down N-MOS 4 on the one hand, and the pull-up P-MOS 5 and the pull-down N-MOS 2 on the other.

It is also necessary to match the voltage trace of the drain-to-source voltage of pull-up P-MOS 8 with that of pull-down N-MOS 4; and to match the voltage trace of the drain-to-source voltage of the pull-down N-MOS 2 with that of the pull-up P-MOS 5. For this reason, during the output voltage transition stage, the drain-to-source voltages of the P-driving transistor P-MOS 7 and the N-driving transistor N-MOS 1 should be sufficiently small in comparison with those of the pull-up P-MOS 8 and the pull-down N-MOS 2.

To provide the non-inverted signal output terminal 14 and the inverted signal output terminal 13 with the same capacitive loading conditions, it is advisable to connect a buffer device having the same input capacity to each terminal, in order to realize a more preferable phase difference.

As described above, the phase differential generation circuit of this invention generates a non-inverted signal and an inverted signal having a high synchronicity to the original signal without the necessity of having an output signal timing adjusting device. It follows that variable capacitors or conventional driving circuitry are not necessary, thus permitting to realize precision phase differential buffer circuit within a small layout area.

The above embodiment is meant to be illustrative and does not restrict the invention in any way. It is clear that other types of circuitry can be devised or the inventive circuit can be simplified without departing from the basic principle outlined above that time-dependency in inverted and non-inverted signals to an original input signal can be produced by carefully matching the gate-to-source voltage vs. drain-to-source characteristics of the pull-up and pull down transistors, and controlling their output potentials.

What is claimed is:

1. A phase differential circuit comprising:
a first inverter circuit for inverting an input signal;
a second inverter circuit for non-inverting said input signal, wherein said second inverter includes a first output transistor and a second output transistor;
said first output transistor connected between a first power supply terminal and a first output terminal having a gate terminal connected to a second output terminal of said first inverter;
said second output transistor connected between a second power supply terminal and said first output terminal having a gate terminal connected to a third output terminal of said first inverter;
a first transfer means connected between a fourth output terminal of said first inverter and a second output terminal for transferring a signal from said fourth output terminal of said first inverter to said second output terminal;
a second transfer means connected between said fourth output terminal of said first inverter and said third output terminal for transferring said signal from said fourth output terminal of said first inverter to said third output terminal;
wherein the current driving capacity of said first output transistor and the current driving capacity of said first transfer means are matched, and the current driving capacity of said second output transistor and the current driving capacity of said second transfer means are matched.

2. A phase differential circuit as claimed in claim 1, wherein said first output transistor is a P channel MOS transistor, and said second output transistor is a N channel MOS transistor.

3. A phase differential circuit as claimed in claim 2, wherein said first transfer means is a N channel MOS transistor having a gate terminal connected to said first power supply terminal, and said second transfer means is a P channel transistor having a gate terminal connected to said second power supply terminal.

4. A circuit for generating an inverted digital signal and a non-inverted signal, each signal having a synchronicity to an original digital signal, said circuit comprising:
a first N-MOS transistor for pull-down of said non-inverted signal output of said original input signal;
a first P-MOS transistor for pull-up of said inverted output signal of said original input signal;
a second P-MOS transistor for driving said first P-MOS transistor; and
a second N-MOS transistor for potential control of said first N-MOS transistor;
wherein said first N-MOS transistor has a source terminal at a ground potential and a drain terminal connected to an output terminal of said non-inverted signal,
said first P-MOS transistor has a gate terminal at a ground potential and a drain terminal connected to an output terminal of said inverted signal; and
a gate terminal of said first N-MOS transistor, a source terminal of said first P-MOS transistor, a drain terminal of said second P-MOS transistor and a drain terminal of said second N-MOS transistor are all connected to a common point such that push-pull signals are generated in a complimentary circuit configuration.

5. A phase differential circuit comprising:
a first P channel MOS transistor connected between a first power supply terminal and a first node having a gate terminal connected to an input terminal;

a second P channel MOS transistor connected between said first power supply terminal and a second node having a gate terminal connected to said input terminal;

a third P channel MOS transistor connected between said first power supply terminal and a first output terminal having a gate terminal connected to said second node;

a first N channel MOS transistor connected between a second power supply terminal and said second node having a gate terminal connected to said input terminal;

a second N channel MOS transistor connected between said second power supply terminal and said first node having a gate terminal connected to said input terminal;

a third N channel MOS transistor connected between said second power supply terminal and said first output terminal having a gate terminal connected to said first node;

a first transfer means connected between said first node and a second output terminal;

a second transfer means connected between said second node and said second output terminal;

wherein the current driving capacity of said first transfer means and the current driving capacity of said third N channel MOS transistor are matched; and wherein the current driving capacity of said second transfer means the current driving capacity of said third P channel MOS transistor are matched.

* * * * *